(12) United States Patent
Ma et al.

(10) Patent No.: US 11,309,238 B2
(45) Date of Patent: Apr. 19, 2022

(54) LAYOUT STRUCTURE OF A FLEXIBLE CIRCUIT BOARD

(71) Applicant: CHIPBOND TECHNOLOGY CORPORATION, Hsinchu (TW)

(72) Inventors: Yu-Chen Ma, Kaohsiung (TW); Hsin-Hao Huang, Kaohsiung (TW); Wen-Fu Chou, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/227,470

(22) Filed: Apr. 12, 2021

(65) Prior Publication Data

US 2022/0037238 A1    Feb. 3, 2022

(30) Foreign Application Priority Data

Jul. 31, 2020   (TW) .................................. 109126047

(51) Int. Cl.
*H05K 1/18*       (2006.01)
*H01L 23/498*    (2006.01)
*H01L 23/00*      (2006.01)

(52) U.S. Cl.
CPC .... *H01L 23/4985* (2013.01); *H01L 23/49838* (2013.01); *H01L 24/16* (2013.01); *H05K 1/189* (2013.01); *H01L 2224/16225* (2013.01); *H01L 2924/351* (2013.01); *H05K 2201/10674* (2013.01); *H05K 2201/10681* (2013.01)

(58) Field of Classification Search
CPC .......... H01L 23/4985; H01L 23/49838; H01L 24/16; H01L 2224/162225; H05K 1/189
USPC ....................................................... 174/254
See application file for complete search history.

(56) References Cited

U.S. PATENT DOCUMENTS 5,936,850 A     8/1999  Takahashi et al.

FOREIGN PATENT DOCUMENTS

TW          201626015 A       7/2016

OTHER PUBLICATIONS

Taiwanese Office Action dated Apr. 28, 2021 for Taiwanese Patent Application No. 109126047, 4 pages.

*Primary Examiner* — Tremesha S Willis
(74) *Attorney, Agent, or Firm* — Demian K. Jackson; Jackson IPG PLLC

(57) ABSTRACT

A layout structure of flexible circuit board includes a flexible substrate, a chip and a circuit layer. A chip mounting area and a circuit area are defined on a top surface of the flexible substrate, the circuit area surrounds the chip mounting area. The chip is mounted on the chip mounting area of the top surface and includes a bump. The circuit layer is disposed on the top surface. A connection portion of the circuit layer extends across a first side of the chip mounting area and into the chip mounting area. A transmission portion of the circuit layer is located on the circuit area and electrically connected to the connection portion. A stress release portion of the circuit layer is located between the transmission portion and a second side of the chip mounting area and is a comb-shaped structure.

16 Claims, 3 Drawing Sheets

LAYOUT STRUCTURE OF A FLEXIBLE CIRCUIT BOARD

FIELD OF THE INVENTION

This invention relates to a flexible circuit board, and more particularly to a layout structure of a flexible circuit board.

BACKGROUND OF THE INVENTION

In conventional flexible circuit board, such as TCP (tape on carrier) or COF (chip on film) package, a patterned circuit layer is arranged on a flexible substrate, then a chip is flip-mounted on the flexible substrate and electrically connected to the circuit layer. A fine-pitch flexible circuit board having circuit lines with highly density and narrow width is adequate for smaller-size electronic equipment. However, the different thermal expansion behavior of the flexible substrate and the circuit layer during thermal bonding of the chip to the circuit layer on the flexible substrate may cause stress concentration and damage on the circuit layer around the chip.

SUMMARY

One object of the present invention is to provide a stress release portion adjacent to a chip mounting area defined on a flexible substrate so as to protect a circuit layer around a chip from breaking caused by stress concentration.

A layout structure of flexible circuit board of the present invention includes a flexible substrate, a chip and a circuit layer. A chip mounting area and a circuit area are defined on a top surface of the flexible substrate, and the circuit area surrounds the chip mounting area having a first side and a second side. The chip is mounted on the chip mounting area of the top surface and includes a bump. The circuit layer is disposed on the top surface and includes a connection portion, a transmission portion and a stress release portion. The connection portion extends across the first side and into the chip mounting area and is electrically connected to the bump. The transmission portion is located on the circuit area and adjacent to the second side. A space of between 100 um and 800 um exists between the transmission portion and the second side of the chip mounting area. The stress release portion is located between the transmission portion and the second side of the chip mounting area and is a comb-shaped structure.

The stress release portion of the present invention is disposed between the transmission portion and the second side of the chip mounting area and used to avoid stress concentration on the second side of the chip mounting area and protect the connection portion from breaking. As a result, the manufacturing yield rate of the flexible circuit board can be improved.

DETAILED DESCRIPTION OF THE INVENTION

Figure 1:
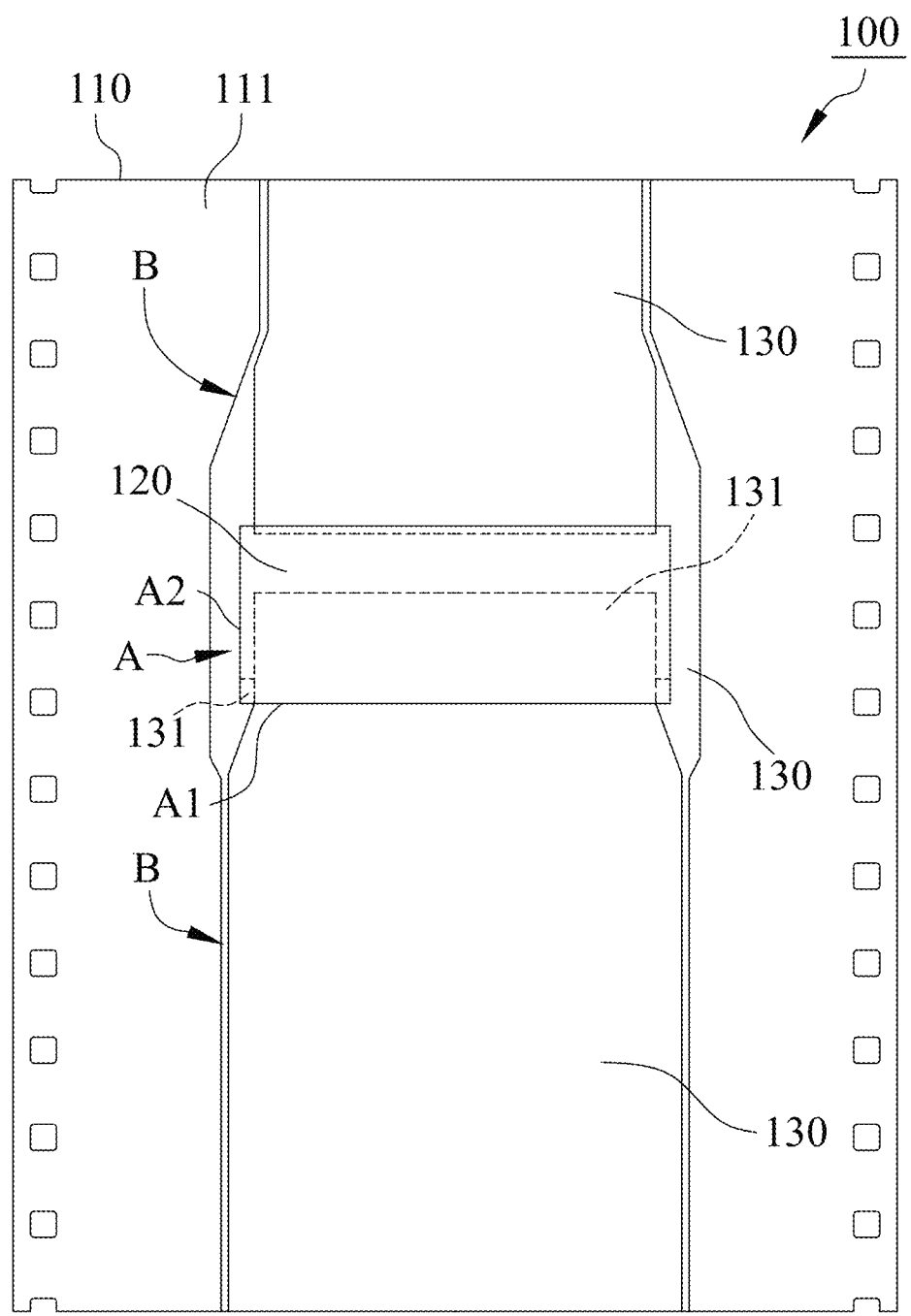
FIG. 1 is a top-view diagram illustrating a flexible circuit board in accordance with one embodiment of the present invention.
Figure 2:
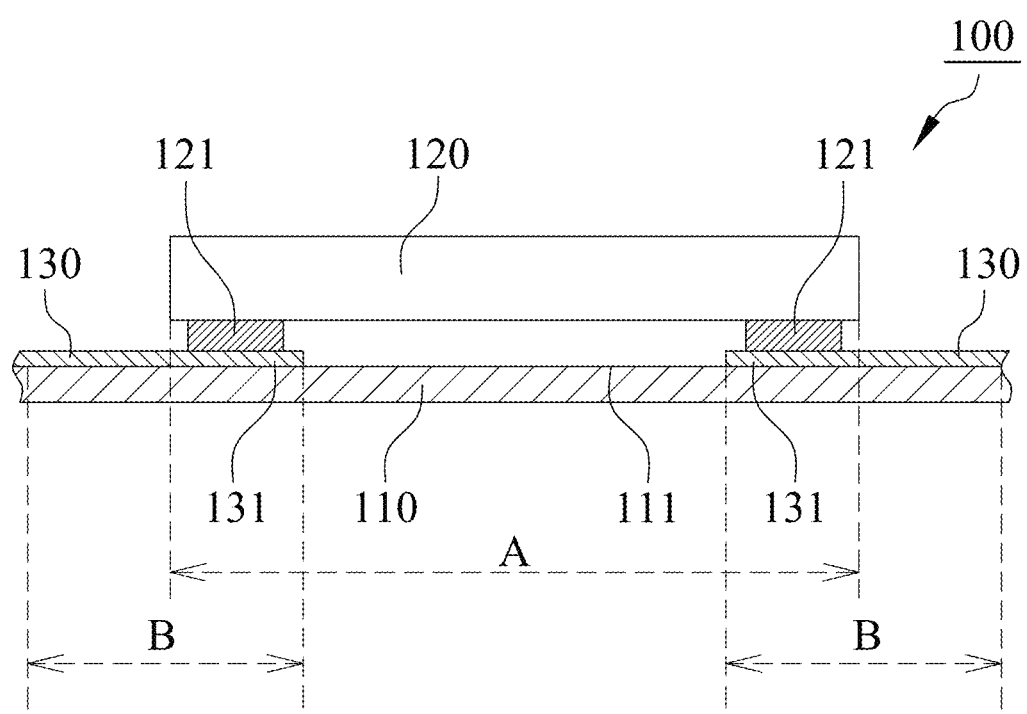
FIG. 2 is a partial cross-sectional view diagram illustrating the flexible circuit board in accordance with one embodiment of the present invention.

With reference to FIG. 1, a flexible circuit board 100 in accordance with one embodiment of the present invention includes a flexible substrate 110, a chip 120 and a circuit layer 130. The chip 120 and the circuit layer 130 are disposed on a top surface 111 of the flexible substrate 110. The circuit layer 130 shown in FIG. 1 is simplified to a sheet, and in practice, the circuit layer 130 is composed of many fine lines. With reference to FIGS. 1 and 2, a chip mounting area A and a circuit area B are defined on the top surface 111 of the flexible circuit board 110. The area for the mounting of the chip 120 on the top surface 111 is defined as the chip mounting area A, the area except the chip mounting area A on the top surface 111 is defined as the circuit area B, and the circuit area B surrounds the chip mounting area A. The chip mounting area A has a first side A1 and a second side A2 that are perpendicular to each other, and in this embodiment, the first side A1 is longer than the second side A2. In other embodiments, the first side A1 may be shorter than the second side A2. Preferably, the second side A2 has a length of greater than or equal to 3 mm.

The circuit layer 130 may be formed by etching a copper layer plated or laminated on the top surface 111 of the flexible substrate 110, and the chip 120 may be flip-mounted on the top surface 111 of the flexible substrate 110 and eutectic bonded to the circuit layer 130 by thermal compression.

With reference to FIG. 2, the circuit layer 130 includes a connection portion 131 which extends across the first side A1 and into the chip mounting area A. A part of the connection portion 131 is located on the chip mounting area A such that bumps 121 of the chip 120 can be electrically connected to the connection portion 131 of the circuit layer 130 for signal transmission between the chip 120 and the circuit layer 130 when the chip 120 is flip-mounted on the top surface 111 of the flexible substrate 110.

Figure 3:
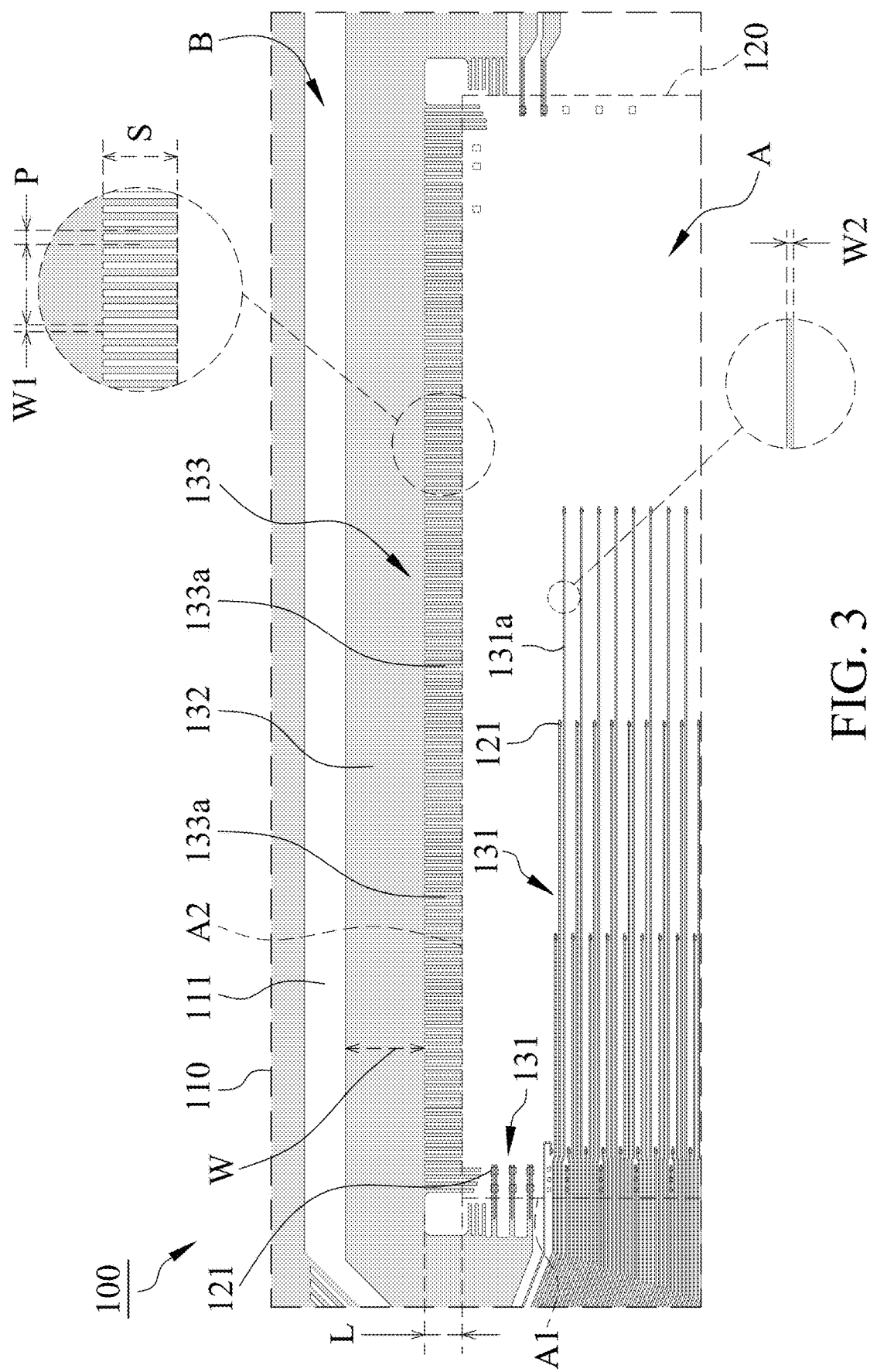
FIG. 3 is a partial enlarged diagram illustrating the flexible circuit board in accordance with one embodiment of the present invention.

FIG. 3 is a partial enlarged diagram showing the second side A2 of the chip mounting area A defined on the top surface 111. In this embodiment, the circuit layer 130 further includes a transmission portion 132 and a stress release portion 133. The transmission portion 132 is located on the circuit area B of the top surface 111 and adjacent to the second side A2. In this embodiment, the transmission portion 132 is electrically connected to the connection portion 131 for signal transmission between the bumps 121 and outer leads (not shown) of the circuit layer 130. The stress release portion 133 is a comb-shaped structure and located between the transmission portion 132 and the second side A2 of the chip mounting area A.

In this embodiment, a width W of the transmission portion 132 is greater than 50 um and a space S between the transmission portion 132 and the second side A2 of the chip mounting area A is from 100 um to 800 um. Owing to the transmission portion 132 is adjacent to the second side A2 of the chip mounting area A, has a greater width W and a longer length along the second side A2, it may cause a significant temperature variation on the second side A2 of the chip mounting area A and pull the chip mounting area A to be stressed during thermal compression of the chip 120. Further, the stress concentration on the fine lines disposed on the chip mounting area A may break the connection portion 131 near the second side A2.

With reference to FIG. 3, the stress release portion 133 of the circuit layer 130 is provided to release the stress on the flexible substrate 110 caused by the transmission portion 132 so as to protect the connection portion 131 from breaking. In this embodiment, the stress release portion 133 is electrically connected to the transmission portion 132 and includes many finger-like leads 133a. There is a pitch P greater than 16 um between the adjacent finger-like leads 133a such that the copper clad area near the second side A2 of the chip mounting area A can be reduced to release the stress. Furthermore, each of the finger-like leads 133a has a length L between 100 um and 1000 um. The longer length the finger-like leads 133a have, the greater space S between the transmission portion 132 and the second side A2 and the lower influence of the transmission portion 132 on the chip mounting area A. Each of the finger-like leads 133a has a first width W1 and an inner lead 131a of the connection portion 131 has a second width W2, the inner lead 131a is susceptible to stress concentration because the second width W2 is less than 15 um. The first width W1 is preferably greater than or equal to the second width W2 such that the finger-like leads 133a having a line width greater than or equal to that of the inner lead 131a can mitigate the stress concentration on the connection portion 131.

In this embodiment, preferably, the finger-like leads 133a of the stress release portion 133 don't extend into the chip mounting area A, and terminals of the finger-like leads 133a are aligned with the second side A2 of the chip mounting area A so the length L of each of the finger-like leads 133a is between 100 um and 800 um. Underfill between the chip 120 and the top surface 111 can flow without interruption because the circuit layer 130 is not across the second side A2 of the chip mounting area A.

In the present invention, the stress release portion 133, disposed between the transmission portion 132 and the second side A2 of the chip mounting area A, is provided to avoid stress concentration on the circuit layer 130 located on the second side A2 of the chip mounting area A so as to protect the connection portion 131 from damage and improve production yield rate of the flexible circuit board 100.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A layout structure of flexible circuit board comprising:
   a flexible substrate including a top surface, a chip mounting area and a circuit area are defined on the top surface, the circuit area surrounds the chip mounting area having a first side and a second side;
   a chip mounted on the chip mounting area of the top surface and including a bump; and
   a circuit layer disposed on the top surface and including a connection portion, a transmission portion and a stress release portion, the connection portion extends across the first side and into the chip mounting area and is electrically connected to the bump, the transmission portion is located on the circuit area and adjacent to the second side, a space of between 100 um and 800 um exists between the transmission portion and the second side of the chip mounting area, the stress release portion is located between the transmission portion and the second side of the chip mounting area and is a comb-shaped structure.

2. The layout structure of flexible circuit board in accordance with claim 1, wherein a width of the transmission portion is greater than 50 um.

3. The layout structure of flexible circuit board in accordance with claim 2, wherein the stress release portion includes a plurality of finger-like leads, a pitch between two adjacent of the plurality of finger-like leads is greater than 16 um.

4. The layout structure of flexible circuit board in accordance with claim 3, wherein the circuit layer is not across the second side of the chip mounting area.

5. The layout structure of flexible circuit board in accordance with claim 4, wherein a terminal of each of the plurality of finger-like leads is aligned with the second side of the chip mounting area.

6. The layout structure of flexible circuit board in accordance with claim 3, wherein a length of each of the plurality of finger-like leads is between 100 um and 1000 um.

7. The layout structure of flexible circuit board in accordance with claim 6, wherein a terminal of each of the plurality of finger-like leads is aligned with the second side of the chip mounting area, and the length of each of the plurality of finger-like leads is between 100 um and 800 um.

8. The layout structure of flexible circuit board in accordance with claim 3, wherein each of the plurality of finger-like leads has a first width, an inner lead of the connection portion has a second width, the first width is greater than or equal to the second width, the second width is less than 15 um.

9. The layout structure of flexible circuit board in accordance with claim 1, wherein the stress release portion includes a plurality of finger-like leads, a pitch between two adjacent of the plurality of finger-like leads is greater than 16 um.

10. The layout structure of flexible circuit board in accordance with claim 9, wherein the circuit layer is not across the second side of the chip mounting area.

11. The layout structure of flexible circuit board in accordance with claim 10, wherein a terminal of each of the plurality of finger-like leads is aligned with the second side of the chip mounting area.

12. The layout structure of flexible circuit board in accordance with claim 9, wherein a length of each of the plurality of finger-like leads is between 100 um and 1000 um.

13. The layout structure of flexible circuit board in accordance with claim 12, wherein a terminal of each of the plurality of finger-like leads is aligned with the second side of the chip mounting area, and the length of each of the plurality of finger-like leads is between 100 um and 800 um.

14. The layout structure of flexible circuit board in accordance with claim 9, wherein each of the plurality of finger-like leads has a first width, an inner lead of the connection portion has a second width, the first width is greater than or equal to the second width, the second width is less than 15 um.

15. The layout structure of flexible circuit board in accordance with claim 1, wherein the transmission portion is electrically connected to the connection portion and the stress release portion.

16. The layout structure of flexible circuit board in accordance with claim 1, wherein the second side of the chip mounting area has a length of greater than or equal to 3 mm.

* * * * *